United States Patent [19]

Furuta et al.

[11] Patent Number: 5,759,674
[45] Date of Patent: *Jun. 2, 1998

[54] LAMINATE OF LIQUID CRYSTAL POLYESTER RESIN COMPOSITION FILM AND METALLIC FOIL, AND PRINTED-WIRING BOARD USING THE SAME

[75] Inventors: Motonobu Furuta, Chiba; Takanari Yamaguchi, Tsukuba, both of Japan

[73] Assignee: Sumitomo Chemical Company, Limited, Osaka, Japan

[*] Notice: The term of this patent shall not extend beyond the expiration date of Pat. No. 5,612,101.

[21] Appl. No.: 625,031

[22] Filed: Mar. 29, 1996

[30] Foreign Application Priority Data

Mar. 31, 1995 [JP] Japan ................. 7-075620

[51] Int. Cl.$^6$ ............. B32B 3/00; B32B 15/08; C09K 19/00
[52] U.S. Cl. ............. 428/209; 428/1; 428/458; 428/901; 525/176
[58] Field of Search ............. 428/1, 209, 458, 428/901; 525/176

[56] References Cited

U.S. PATENT DOCUMENTS

| | | | |
|---|---|---|---|
| 4,384,016 | 5/1983 | Ide et al. | 428/1 |
| 4,717,624 | 1/1988 | Ikenaga et al. | 428/423.1 |
| 4,966,807 | 10/1990 | Harvey et al. | 428/220 |
| 4,975,312 | 12/1990 | Lusignea et al. | 428/209 |
| 5,216,073 | 6/1993 | Haider et al. | 525/66 |
| 5,248,530 | 9/1993 | Jester et al. | 428/1 |
| 5,612,101 | 3/1997 | Furuta et al. | 428/1 |

FOREIGN PATENT DOCUMENTS

| | | |
|---|---|---|
| 0 672 721 A2 | 9/1995 | European Pat. Off. |
| 0 737 707 A2 | 10/1996 | European Pat. Off. |
| 59-46786 | 11/1984 | Japan |
| 61-130041 | 6/1986 | Japan |
| 63-237424 | 10/1988 | Japan |
| 63-264340 | 11/1988 | Japan |
| 2-252738 | 10/1990 | Japan |
| 3-148194 | 6/1991 | Japan |
| 3-183185 | 8/1991 | Japan |
| 4-136038 | 5/1992 | Japan |
| 0542603 | 2/1993 | Japan |
| 5-226796 | 9/1993 | Japan |
| WO 89/12550 | 12/1989 | WIPO |

*Primary Examiner*—Cathy F. Lam
*Attorney, Agent, or Firm*—Birch, Stewart, Kolasch & Birch, LLP

[57] ABSTRACT

A laminate of a film of a liquid crystal polyester resin includes (A) from 55 through 99% by weight of a liquid crystal polyester and (B) from 45 through 1% by weight of an epoxy group-containing thermoplastic resin laminated on a metallic foil, and is useful for producing a printed-wiring board. The laminate is excellent in heat resistance, processibility and flexibility and is inexpensive and therefore suitable for producing printed-wiring boards.

18 Claims, No Drawings

LAMINATE OF LIQUID CRYSTAL POLYESTER RESIN COMPOSITION FILM AND METALLIC FOIL, AND PRINTED-WIRING BOARD USING THE SAME

BACKGROUND OF THE INVENTION

1. Field of the Invention

The present invention relates to a laminate having excellent moldability, heat resistance and flexibility and a printed-wiring board using the same.

2. Background Information

Recently, there has been a greatly increasing demand for flexible printed-wiring boards and film carrier tapes comprising a laminate of a resin film and a metallic foil. In response to requests, in the market, for lighter and less costly electric and electronic parts, laminates of a thermosetting resin such as a phenol resin or epoxy resin and a metallic foil have hitherto been developed. These laminates, however, have drawbacks in that they are inferior in productivity and expensive.

Laminates of a thermoplastic resin and a metallic foil are known as disclosed, for example, by JP-B-59-46786 which discloses a method for producing a printed-wiring board by heat-pressing a film of polyethylene terephthalate (which may hereinafter be abbreviated as PET) and a metallic foil. The printed-wiring board obtained in this method, however, is insufficient in heat resistance due to the low heat resistance of PET.

Also, JP-A-61-130041 discloses a method for producing a laminate for a printed-wiring board by molding a film of a liquid crystal polymer and a metallic film using a pressing machine. JP-A-2-252738, U.S. Pat. No. 4,966,807, JP-A-3-183185, and JP-A-5-42603 disclose methods for producing a film of liquid crystal polymer for a printed-wiring board, wherein the method for producing the laminate for a printed-wiring board includes heat-pressing a film of liquid crystal polymer and a metallic film.

The printed-wiring board including a liquid crystal polymer suffers from various drawbacks, since the liquid crystal polymer is not easily molded into a film by the usual methods due to inferior film processability, the film obtained is easily deformed due to large anisotropy and a flexible printed-wiring board is obtained with difficulty due to the high rigidity.

The object of the present invention is to solve the above problems and to provide a laminate and a printed-wiring board, which are manufactured at low cost and have excellent heat resistance, processability and flexibility.

SUMMARY OF THE INVENTION

Accordingly, the present invention provides a laminate of a film of a liquid crystal polyester resin comprising (A) from 55 through 99% by weight of a liquid crystal polyester and (B) from 45 through 1% by weight of an epoxy group-containing thermoplastic resin laminated on a metallic foil, and a base for a printed-wiring board comprising said laminate.

DETAILED DESCRIPTION OF THE INVENTION

The present invention is described in more detail in the following description.

The liquid crystal polyester as component (A) in the liquid crystal polyester resin composition used in the present invention is a polyester called a thermotropic liquid crystal polymer.

Specifically, said polyester includes:

(1) one produced from a combination of an aromatic dicarboxylic acid, an aromatic diol and an aromatic hydroxycarboxylic acid, (2) one produced from a combination of different kinds of aromatic hydroxycarboxylic acids, (3) one produced from a combination of an aromatic dicarboxylic acid and a nuclear substituted aromatic diol, and (4) one obtainable by the reaction of a polyester such as polyethylene terephthalate or the like and an aromatic hydroxycarboxylic acid.

These polyesters form an isotropic melt at a temperature of 400° C. or below.

The aromatic dicarboxylic acid, the aromatic diol, and the aromatic hydroxycarboxylic acid may be replaced by ester derivatives thereof. Exemplified repeating units of the liquid crystal polyester are given below.

Repeating units originating from aromatic dicarboxylic acids:

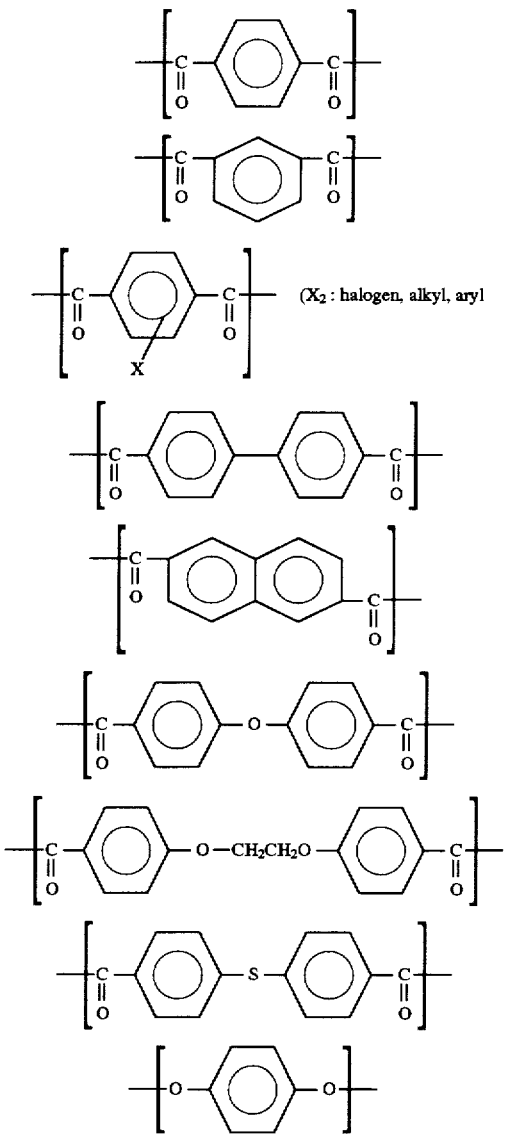

-continued

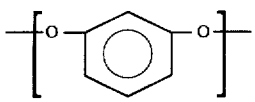

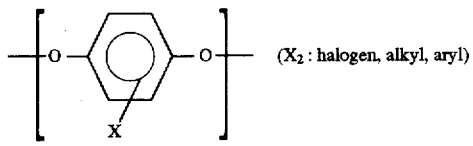 (X₂ : halogen, alkyl, aryl)

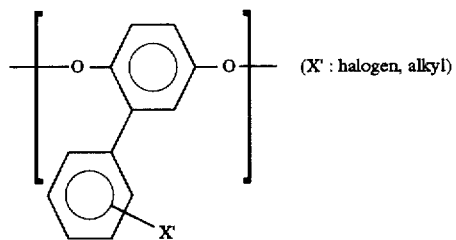 (X' : halogen, alkyl)

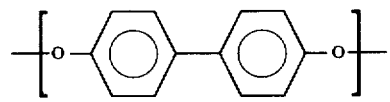

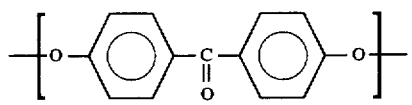

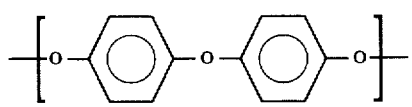

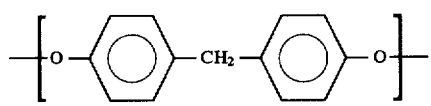

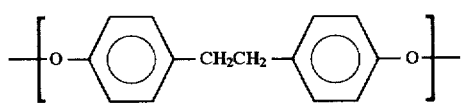

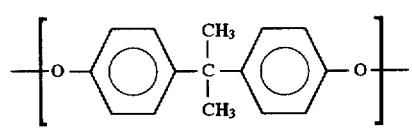

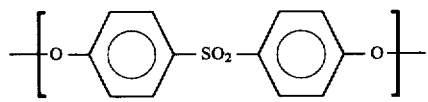

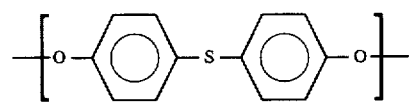

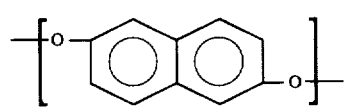

-continued

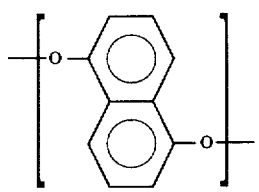

Repeating units originating from aromatic hydroxycarboxylic acids:

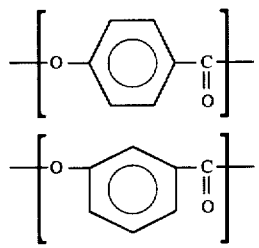

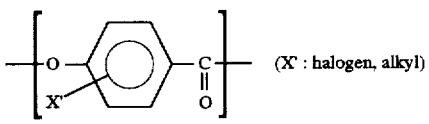 (X' : halogen, alkyl)

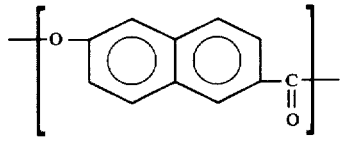

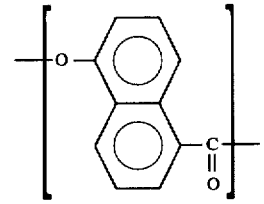

In view of well-balanced heat resistance, mechanical properties and melt processabilities, the preferred liquid crystal polyester has the following repeating unit:

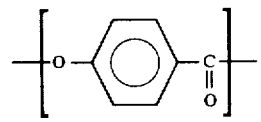

and more specifically a combination of repeating units (I) through (VI):

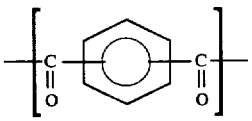 (I)

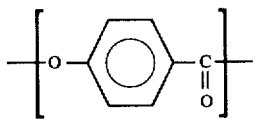

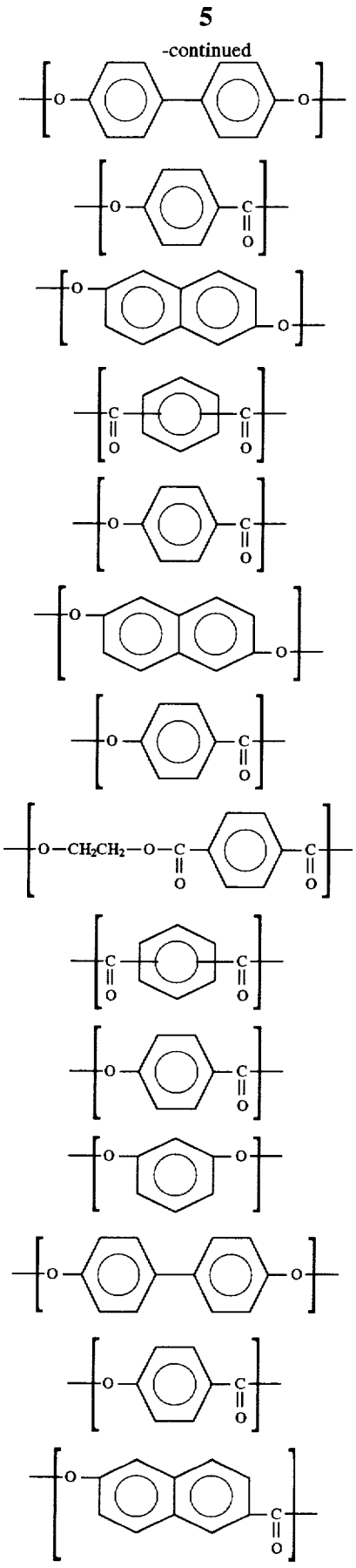

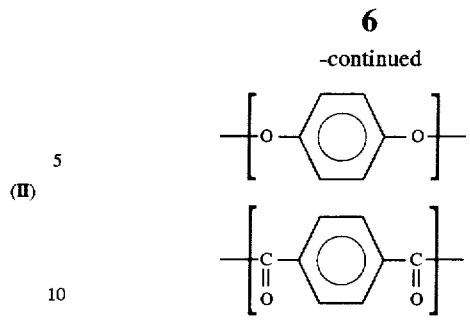

The production of the liquid crystal polyesters (I) through (VI) is described, for example, in JP-B-47-47870, JP-B-63-3888, JP-B-63-3891, JP-B-63-18016 and JP-B-2-51523, respectively.

Preferred combinations of the units are combinations (I), (II) and (IV), and more preferred combinations are combinations (I) and (II).

For application of the laminate to fields in which a higher heat resistance is required, the liquid crystal polyester of component (A) in the liquid crystal polyester resin composition preferably includes 30 through 80 percent of a repeating unit (a'), 0 through 10 percent of a repeating unit (b'), 0 through 25 percent of a repeating unit (c'), and 10 through 35 percent of a repeating unit (d') in molar fractions.

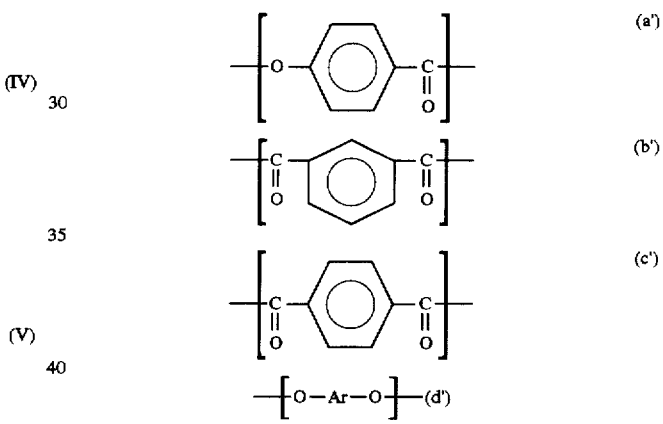

wherein Ar represents a divalent aromatic group.

The component (B) in the liquid crystal polyester resin composition used in the present invention is an epoxy group-containing thermoplastic resin.

Preferred examples of the epoxy group include a glycidyl group.

Preferred monomers having a glycidyl group include a glycidyl ester of unsaturated carboxylic acid, unsaturated glycidyl ether and the like. A preferred thermoplastic resin (B) is a copolymer containing 0.1 through 30 percent by weight of an unsaturated glycidyl carboxylate unit and/or unsaturated glycidyl ether unit.

Preferred examples of the epoxy group-containing thermoplastic resin (B) include epoxy group-containing ethylene copolymers comprising:

(a) 50 through 99.9 percent by weight of an ethylene unit;

(b) 0.1 through 30 percent by weight and more preferably 1 through 30 percent by weight of an unsaturated glycidyl carboxylate unit and/or an unsaturated glycidyl ether unit; and (c) 0 through 49.9 percent by weight of an ethylenically unsaturated ester compound unit.

The epoxy group-containing ethylene copolymers having the components (a), (b) and (c) in amounts within the range shown above are preferred because they give a liquid crystal polyester resin composition with excellent heat resistance, processability etc.

Compounds having the unsaturated glycidyl carboxylate unit or the unsaturated glycidyl ether unit are represented by the following formulae:

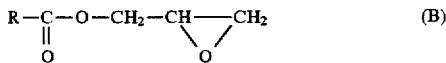 (B)

wherein R represents a hydrocarbon group having an ethylenically unsaturated bond and containing 2 through 13 carbon atoms.

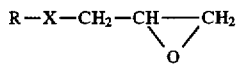

wherein R represents a hydrocarbon group having an ethylenically unsaturated bond and containing 2 through 18 carbon atoms, and X denotes —$CH_2$—O— or a group:

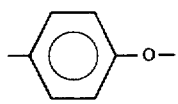

Specific examples of the unsaturated glycidyl carboxylate include glycidyl acrylate, glycidyl methacrylate, diglycidyl itaconate, triglycidyl butenetricarboxylate, glycidyl p-styrene-carboxylate and the like.

Examples of the unsaturated glycidyl ether include vinyl glycidyl ether, allyl glycidyl ether, methallyl glycidyl ether and the like.

The above epoxy group-containing ethylene copolymer may be a terpolymer or multi-unit copolymers containing ethylene, unsaturated glycidyl carboxylate or unsaturated glycidyl ether, and ethylenically unsaturated ester compound (c).

Examples of ethylenically unsaturated ester compounds (c) include vinyl carboxylates and alkyl $\alpha$, $\beta$-unsaturated carboxylates, such as vinyl acetate and vinyl propionate, methyl acrylate, ethyl acrylate, butyl acrylate, methyl methacrylate, ethyl methacrylate, and butyl methacrylate. Vinyl acetate, methyl acrylate, and ethyl acrylate are especially preferable.

The above epoxy group-containing ethylene copolymers may contain, in addition to the above monomers, other monomers which can be copolymerized with the above monomers. Examples of said other monomers include isobutylene, styrene and its derivatives, halogenated olefins such as tetrafluoro-ethylene and hexafluoro-propylene and the like.

Specific examples of the epoxy group-containing ethylene copolymers include a copolymer comprising an ethylene unit and a glycidyl methacrylate unit, a copolymer comprising an ethylene unit, a glycidyl methacrylate unit and a methyl acrylate unit, a copolymer comprising an ethylene unit, a glycidyl methacrylate unit and an ethyl acrylate unit, a copolymer comprising an ethylene unit, a glycidyl methacrylate unit and a vinyl acetate unit and the like.

The melt index (hereinafter referred to as MFR: measured at 190° C. under a load of 2.16 kg in conformity with JIS K6760) of the epoxy group-containing ethylene copolymer is preferably in a range of 0.5 through 100 g/10 minutes and more preferably in a range of 2 through 50 g/10 minutes. The melt index outside the range is allowable but the index greater than 100 g/10 minutes results in poor mechanical properties of the resulting resin composition while that less than 0.5 g/10 minutes lowers the compatibility with the liquid crystal polyester of component (A) and therefore both cases are not preferred.

The epoxy group-containing ethylene copolymer preferably has a stiffness modulus in a range of 10 through 1500 kg/cm² and more preferably in a range of 20 through 1300 kg/cm². A stiffness modulus outside of the above range may result in insufficient processibility of the resulting resin composition and insufficient mechanical properties of the resulting film.

The epoxy group-containing ethylene copolymer is prepared by copolymerizing an unsaturated epoxy compound and ethylene in the presence of a radical polymerization initiator at 500 through 4000 atm and 100° through 300° C. in the presence or absence of an appropriate solvent and a chain transfer agent.

As regards the ratio of the component (A) to the component (B) included in the liquid crystal polyester resin composition of the invention, the content of the component (A) is 55 through 99 percent by weight and more preferably 65 through 98 percent by weight while the content of the component (B) is within a range of 45 through 1 percent by weight and more preferably in a range of 35 through 2 percent by weight.

If the content of the component (A) is less than 55 percent by weight the heat resistance of the resulting resin composition is lowered, and if the same is greater than 99 percent by weight, the anisotropy may not be sufficiently improved and the cost increases.

The liquid crystal polyester resin composition used in the invention may be manufactured by any known method without particular limitation. For example, the components dissolved in a solvent are mixed and recovered by evaporation of the solvent or precipitation. An industrially preferable method is to knead the components in a molten state. Known kneading apparatuses include single screw extruders, twin-screw extruders, and various kneaders are applicable to the melt-kneading process. Especially, biaxial high-speed kneaders are preferably applied.

For the kneading process, the temperature in the cylinders of the kneading machine is set in a range of 200° through 360° and more specifically in a range of 230° through 340° C.

Each component may be pre-mixed to the homogeneous state with a tumbling mixer or Henschel mixer. However, the components may be separately introduced quantitatively into a kneader without pre-mixing.

An inorganic filler may be added, if desired, to the liquid crystal polyester resin composition used in the invention. Examples of the applicable inorganic filler include calcium carbonate, talc, clay, silica, magnesium carbonate, barium sulfate, titanium oxide, alumina, plaster, glass flakes, glass fibers, carbon fibers, alumina fibers, silica alumina fibers, aluminum borate whiskers, and potassium titanate fibers.

Various additives may also be added to the liquid crystal polyester resin composition used in the invention, if desired, in the preparation process or the subsequent processing process. Such additives include organic fillers, antioxidants, heat stabilizers, light stabilizers, flame retardants, lubricants, antistatic agents, inorganic or organic colorants, rust preventives, crosslinking agents, foaming agents, fluorescent agents, surface smoothing agents, surface gloss improvers and mold release agents such as fluoropolymers.

Films obtainable from the liquid crystal polyester resin composition used in the invention can be produced by any method without limitation. Preferred resin films for a laminate base are those produced by a method in which the liquid crystal polyester resin composition obtained as above is melt-kneaded in an extruder and the molten resin extruded through a T-die is wound up drawing in the wind-up direction (machine direction) to give a uniaxially oriented film or a biaxially oriented film.

Conditions for the extruder used in molding a uniaxially oriented film may be chosen depending on the liquid crystal polyester resin composition. The setting temperature of the cylinder is preferably within a range of 200° through 360° C. and more preferably within a range of 230° through 340° C. If the temperature is outside this range, the composition may be heat-decomposed or be difficult to be molded into a film.

A preferred gap of the T-die is 0.2 through 0.8 mm.

A preferred draft ratio for the uniaxially oriented film in the invention is within a range of 1.1 through 40.

The draft ratio herein refers to the value of sectional area of the slit of the T-die divided by the sectional area crossing the machine direction of the film. If the draft ratio is less than 1.1, the strength of the film is insufficient and if the draft ratio exceeds 40, the surface smoothness may be insufficient. Therefore both cases are not preferred. The draft ratio can be adjusted by controlling the conditions of the extruder and rate of winding up.

The biaxially oriented film can be produced by extruding the molten composition under conditions similar to those for the uniaxially oriented film, i.e. at a temperature of the cylinder preferably within a range of 200° through 360° C. and more preferably within a range of 230° through 340° C., from a gap of the T-die preferably within a range of 0.2 through 0.8 mm and drawing the molten sheet extruded from the T-die concurrently in the machine direction and in the transverse direction to said machine direction (transverse direction), or alternatively, stepwisely drawing, i.e. drawing the molten sheet extruded from the T-die first in the machine direction and then drawing the oriented sheet in the transverse direction at a high temperature of 100° through 300° C. with a tenter within the same stage.

In the biaxially oriented film, a preferred stretch ratio is 1.1 through 20 times in the machine direction and 1.1 through 20 times in the transverse direction. When the stretch ratio is outside the above ranges, the strength of the film of composition may be insufficient or a film with uniform thickness may be difficult to be produced.

An inflation film which is produced by expanding the molten sheet extruded from a cylindrical die, can be preferably used as the film of the liquid crystal resin composition in the present invention.

Briefly, the liquid crystal polyester resin composition obtained by the above method is fed to a melt-kneading extruder having a die with a circular slit. The molten resin is melt-kneaded at a cylinder temperature of 200° through 360° C. and preferably 230° through 350° C. and extruded upwardly or downwardly through the circular slit of the extruder in the form of a tubular film. The circular slit opening is usually 0.1 through 5 mm and preferably 0.2 through 2 mm. The diameter of the slit is usually 20 through 1000 mm and preferably 25 through 600 mm.

The melt-extruded tubular molten resin film is drafted along the machine direction (MD) and also drafted with expansion in a direction perpendicular to the machine direction, i.e. transverse direction (TD) by blowing the air or a inert gas, for example, nitrogen gas or the like inside the tubular film.

In the inflation method (film extrusion) in the present invention, a preferred blow ratio is 1.5 through 15 and preferred MD draw ratio is 1.5 through 40.

If the conditions for inflation film extrusion are outside the above range, it is difficult to obtain a film of liquid crystal polyester resin composition with uniform thickness, without wrinkles and of high strength.

The expanded film is cooled at the tubular surface with the air or water and then taken up through nip rolls.

In the inflation film extrusion, conditions may be selected so that the tubular molten film is expanded in a state in which the thickness is uniform and the surface is smooth, depending on the constitution of the liquid crystal polyester resin composition.

The practical thickness of the film obtainable from the liquid crystal polyester resin composition used in the present invention is in many cases within a range of 2 through 500 µm and preferably within a range of 5 through 300 µm.

The film obtainable from the liquid crystal polyester resin composition used in the invention may be subjected to surface treatment as necessary. Such surface treatment includes, for example, corona discharge treatment, flame treatment, sputtering treatment, solvent treatment and the like.

The metallic foil usable in the present invention includes a foil of gold, silver, copper, nickel, aluminum or the like, among which copper foil is preferred.

The thickness of the metallic foil used is preferably within a range of 1 through 1000 µm and more preferably within a range of 5 through 100 µm.

The films obtainable from the liquid crystal polyester resin composition and the metallic foil in the present invention have a good adherence to each other and can be adhered without an adhesive. Preferred adhesion is heat-pressing.

The heat-pressing can easily and preferably be effected around the fluidization temperature using a press machine or press rolls.

The laminate of the present invention may be in the form of a structure having an adhesive layer between the liquid crystal polyester film and the metallic foil depending on the requirement of the market.

Preferred specific examples of the adhesive layer include hot-melt adhesives, polyurethane adhesives and the like. Particularly preferred examples are epoxy group-containing ethylene copolymer or the like.

The laminates obtainable by the present invention, which are suitable for a base for printed-wiring board, have two or more layers comprising a film obtainable from the liquid crystal polyester resin composition and a metallic foil and may have, for example, a two layer structure consisting of said film of composition and the metallic foil, a three layer structure consisting of said films of composition laminated on both sides of the metallic foil, a five layers structure consisting of films of composition and metallic foils which are alternately piled or the like.

The laminate obtained by the present invention is excellent in heat resistance of the resin composition and processability into film, and also superior in adhesiveness between the film of resin composition and metal foil, and further has a good flexibility and is inexpensive. Therefore, it is suitable for a base for printed-wiring.

The present invention will now be illustrated by means of Examples which should not be construed as a limitation upon the scope of the invention.

(1) Liquid crystal polyester of component (A)

(i) A mixture containing 10.8 kg (60 moles) of p-acetoxybenzoic acid, 2.49 kg (15 moles) of terephthalic acid, 0.83 kg (5 moles) of isophthalic acid, and 5.45 kg (20.2 moles) of 4,4'-diacetoxydiphenyl was placed in a polymerization vessel equipped with a comb-type agitator and stirred in a nitrogen atmosphere while elevating the temperature up to 330° C. The mixture was polymerized at 330° C. for one hour with vigorous stirring while acetic acid produced as a by-product was continuously removed. The system was gradually cooled to 200° C., at which the polymer obtained was taken out of the system.

The polymer obtained was ground to particles of not greater than 2.5 mm in diameter with a hammer mill (manufactured by Hosokawa Micron Co., Ltd.). The polymer particles were treated in a nitrogen atmosphere at 280° C. in a rotary kiln for three hours, so that granules of aromatic polyester (flow temperature: 324° C.) consisting of repeating units shown below were obtained. The liquid crystal polyester thus obtained is hereinafter referred to as A-1. The polymer showed optical anisotropy under the pressurizing condition at temperatures of not less than 340° C. The ratio of the repeating units of the polyester A-1 is given as follows:

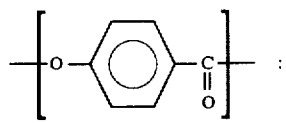

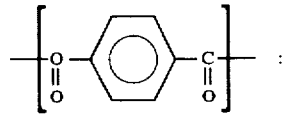

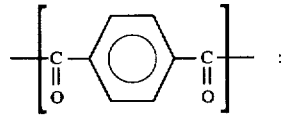

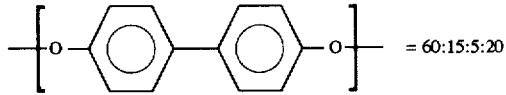

(ii) A mixture containing 16.6 kg (12.1 moles) of p-hydroxybenzoic acid, 8.4 kg (4.5 moles) of 6-hydroxy-2-naphthoic acid, and 18.6 kg (18.2 moles) of acetic anhydride was placed in a polymerization vessel equipped with a comb-type agitator and stirred in a nitrogen atmosphere while elevating the temperature up to 320° C. The mixture was polymerized at 320° C. for one hour and under a reduced pressure of 2.0 torr at 320° C. for another one hour while acetic acid produced as a by-product was continuously removed from the system. The system was gradually cooled to 180° C., at which the polymer obtained as taken out of the system.

The polymer obtained was ground to particles in the same manner as the process (i) and treated in a nitrogen atmosphere at 240° C. in a rotary kiln for five hours, so that granules of aromatic polyester (flow temperature: 270° C.) consisting of repeating units shown below were obtained. The liquid crystal polyester thus obtained is hereinafter referred to as A-2. The polymer showed optical anisotropy under the pressurizing condition at temperatures of not less than 280° C. The ratio of the repeating units of the polyester A-2 is given as follows:

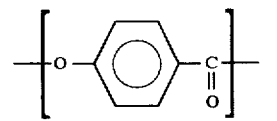

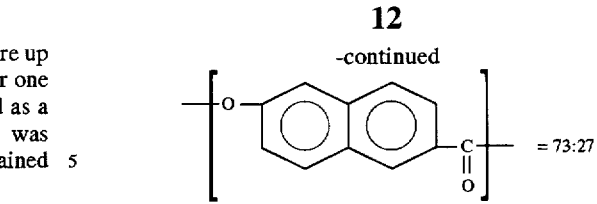

(2) Epoxy group-containing thermoplastic resin (B)

The abbreviations, copolymer composition (weight ratio), MFR and stiffness modulus for the epoxy group-containing ethylene copolymer produced by high-pressure radical polymerization are shown below.

MFR (melt index) was measured according to JIS K6760 at 190° C. under the load of 2.16 kg and shown in g/10 min. Modulus of elasticity was measured according to ASTM D747.

Abbreviation:

B-1: trade name Bondfast 7L manufactured by Sumitomo Chemical Co., Ltd.

Composition: ethylene/glycidyl methacrylate/methyl acrylate=67/3/30 (by weight) MFR=9, stiffness modulus=60 kg/cm$^2$ B-2: trade name Bondfast 20M manufactured by Sumitomo Chemical Co., Ltd.

Composition: ethylene/glycidyl methacrylate/methyl acrylate=64/6/30 (by weight) MFR=20, stiffness modulus=30 kg/cm$^2$ B-3: trade name Bondfast 2B manufactured by Sumitomo Chemical Co., Ltd.

Composition: ethylene/glycidyl methacrylate/vinyl acetate=83/12/5 MFR=3, stiffness modulus=400 kg/cm$^2$ (3) Measurement of physical properties Temperature of deflection under load (hereinafter may be referred to as TDUL): A test piece for TDUL measurement (127 mm in length, 12.7 mm in width and 6.4 mm in thickness) was tested according to ASTM D648.

Stiffness modulus: A test piece (6.4 mm in thickness) was tested according to ASTM D790.

Volume resistivity was measured according t ASTM D257.

Arc resistance was measured according to ASTM D495.

Soldering heat resistance temperature: A JIS No. 1 (½) dumbbell of 0.8 mm in thickness was dipped in a bath of molten solder at 140° C. consisting of 60% of tin and 40% of lead, kept in the bath at the same temperature for 60 seconds, taken out and assessed for external appearance. The test was repeated stepwisely elevating the temperature by 10° C. until the maximum temperature without foaming or deformation of the piece was known. For example, when foaming or deformation of the piece is observed for the first time at 310° C., the soldering heat resistance temperature is 300° C.

Examples 1 through 4 and Reference Examples 1 through 5

The respective components were blended with a Henschel mixer according to the compositions shown in Table 1. Each composition was melt-kneaded with a twin-screw extruder TEX-30 (manufactured by Nihon Seiko Co., Ltd.). The kneaded composition was molded with an injection molding device PS40E5ASE (manufactured by Nissei Resin Industries Co., Ltd.) The properties of each molded article were measured, and the results are shown in Table 1.

Each liquid crystal polyester resin composition obtained as above was also melt-kneaded with a single screw extruder VS20-20 (manufactured by Tanabe Plastics Co., Ltd.) equipped with a T-die as shown in Table 2. The composition was extruded from the T-die having a slit width of 10 cm and a die gap of 0.5 mm winding up the film at a rate of 8 m/min through pressure rollers to give a film having a thickness of 15 through 50 μm. The film obtained as above was piled with an electrolytic copper foil of 18 μm in thickness and heat-pressed at a temperature shown in Table 2 to give a laminate. The peeling strength of the laminate was measured by 180°-peeling method. The result is shown in Table 2.

Examples 5 through 7

The respective components and a stabilizer were blended with a Henschel mixer according to the compositions shown in Table 3. Each composition was melt-kneaded with a twin-screw extruder TEX-30 (manufactured by Nihon Seiko Co., Ltd.). The kneaded composition was molded with an injection molding device PS40E5ASE (manufactured by Nissei Resin Industries Co., Ltd.) The properties of each molded object were measured and the results are shown in Table 3.

Pellets prepared from the above composition were melt-kneaded at a cylinder temperature of 280°-350° C. and a screw speed of 40 rpm with a single screw extruder equipped with a circular die of 100 mm in diameter. The molten resin was extruded upwardly from the circular die of 100 mm in diameter and 1.5 mm in die gap at a die temperature of 280°-350° C. The obtained tubular film was expanded by blowing dry air into its interior space, cooled and wound up at a rate of 15 m/min through nip rolls to give a film of the liquid crystal polyester resin composition.

The draft ratios of the film in the winding-up direction (MD) and the direction perpendicular to the winding-up direction (TD) were controlled by the amount of the dry air to be blown and the rate of winding up of the film.

Onto a rolled copper foil of 15 μm in thickness was sprayed 1% solution of Bondfast E (manufactured by Sumitomo Chemical Co., Ltd.) in chloroform. The foil was piled with a film, having a thickness of 31 μm, of the liquid crystal polyester resin composition of Example 5 in Table 4 and heat-pressed at 290° C. to give a laminate.

The peeling strength of the laminate was measured by 180°-peeling method. The result is shown in Table 4.

On the film of the liquid crystal polyester resin composition of Example 6 in Table 4, Permatac AW-060 (trade name of modified epoxy resin manufactured by Kyodo Yakuhin Co.) was coated and dried to remove the solvent. Aluminum foil of 13 μm in thickness was piled onto the coated face of the above film and heat-pressed at 190° C. for 2 hours to give a laminate.

The peeling strength of the laminate was measured by 180°-peeling method. The result is shown in Table 4.

The film, having a thickness of 11 μm, of the liquid crystal polyester resin composition of Example 7 in Table 4 was heat-pressed with electrolytic copper foils of 10 μm in thickness at 246° C. to give a laminate in the form of copper foil/resin film/copper foil.

The peeling strength of the laminate was measured by 180°-peeling method. The result is shown in Table 4.

TABLE 1

| | Composition (% by weight) | | | Melt-kneading | | Injection-molding | | Physical properties | | | | |
|---|---|---|---|---|---|---|---|---|---|---|---|---|
| | | | | Cylinder temp. | Screw speed | Cylinder temp. | Screw speed | TDUL | Stiffness modulus | Volume resis- tivity | Arc resis- tance | Soldering heat resistant temp. |
| | (A) | (B) | Others | (°C.) | (rpm) | (°C.) | (rpm) | (°C.) | (kg/cm$^2$) | ($\Omega \cdot$ cm) | (sec) | (°C.) |
| Example 1 | A-1 93 | B-1 7 | 0 | 356 | 210 | 350 | 80 | 248 | 38900 | $10^{16}$ | 126 | 290 |
| Example 2 | A-1 81 | B-1 19 | 0 | 353 | 210 | 350 | 80 | 237 | 34200 | $10^{16}$ | 127 | 290 |
| Example 3 | A-1 67 | B-2 33 | 0 | 350 | 210 | 350 | 80 | 191 | 16300 | $10^{16}$ | 127 | 270 |
| Comparative Example 1 | A-1 100 | 0 | 0 | 360 | 220 | 360 | 80 | 258 | 69800 | $10^{15}$ | 124 | 300 |
| Comparative Example 2 | A-1 81 | 0 | *1 19 | 333 | 210 | 330 | 80 | 214 | 36500 | $10^{16}$ | 124 | 260 |
| Example 4 | A-2 60 | B-3 40 | 0 | 288 | 230 | 285 | 60 | 103 | 13200 | $10^{16}$ | 138 | 160 |
| Comparative Example 3 | A-2 100 | 0 | 0 | 290 | 250 | 285 | 60 | 183 | 59600 | $10^{16}$ | 137 | 220 |
| Comparative Example 4 | A-2 60 | 0 | *2 40 | 271 | 220 | 260 | 60 | 118 | 13900 | $10^{16}$ | 138 | 140 |
| Comparative Example 5 | A-2 40 | B-3 60 | 0 | 271 | 220 | 260 | 60 | unmold able | — | — | — | — |

*1: Polyethylene manufactured by Sumitomo Chemical Co., Ltd., trade name Sumikasen F1121-1 (Stiffness modulus: 1600 kg/cm$^2$)
*2: Polyethylene manufactured by Sumitomo Chemical Co., Ltd., trade name Sumikasen G806 (Stiffness modulus: 1300 kg/cm$^2$)

TABLE 2

| | Composition (% by weight) | | | Film molding | | | | | Laminate | |
|---|---|---|---|---|---|---|---|---|---|---|
| | | | | Cylinder temp. | Screw speed | Die Temp. | Die gap | Film thickness | Heat pressing temp. | Peeling strength |
| | (A) | (B) | others | (°C.) | (rpm) | (°C.) | (mm) | (μm) | (°C.) | (kg/cm) |
| Example 1 | A-1 93 | B-1 7 | 0 | 350 | 80 | 350 | 0.5 | 36 | 290 | 1.7 |
| Example 2 | A-1 81 | B-1 19 | 0 | 350 | 80 | 350 | 0.5 | 21 | 290 | 1.8 |
| Example 3 | A-1 67 | B-2 33 | 0 | 350 | 80 | 350 | 0.5 | 50 | 290 | 1.8 |
| Comparative Example 1 | A-1 100 | 0 | 0 | 350 | 80 | 350 | 0.5 | unmoldable | — | — |
| Comparative Example 2 | A-1 81 | 0 | *1 19 | 350 | 80 | 350 | 0.5 | unmoldable | — | — |
| Example 4 | A-2 60 | B-3 40 | 0 | 285 | 60 | 285 | 0.5 | 15 | 245 | 1.9 |
| Comparative Example 3 | A-2 100 | 0 | 0 | 285 | 60 | 285 | 0.5 | unmoldable | — | — |
| Comparative Example 4 | A-2 60 | 0 | *2 40 | 285 | 60 | 285 | 0.5 | unmoldable | — | — |
| Comparative Example 5 | A-2 40 | B-3 60 | 0 | 285 | 60 | 285 | 0.5 | unmoldable | — | — |

TABLE 3

| | Composition (% by weight) | | Melt-kneading | | Injection-molding | | | | | | | Soldering |
|---|---|---|---|---|---|---|---|---|---|---|---|---|
| | | | Cylinder temp. | Screw speed | Cylinder temp. | Screw speed | Mold temp. | TDUL | Stiffness modulus | Volume resistivity | Arc resistance | heat resistant temp. |
| | (A) | (B) | (°C.) | (rpm) | (°C.) | (rpm) | (°C.) | (°C.) | (kg/cm²) | (Ω · cm) | (sec) | (°C.) |
| Example 5 | A-1 87 | B-3 13 | 353 | 210 | 350 | 80 | 80 | 241 | 35300 | $10^{16}$ | 126 | 290 |
| Example 6 | A-1 72 | B-3 28 | 353 | 210 | 350 | 80 | 80 | 209 | 18800 | $10^{16}$ | 127 | 270 |
| Example 7 | A-2 78 | B-1 22 | 288 | 230 | 285 | 80 | 80 | 157 | 40100 | $10^{16}$ | 138 | 210 |

TABLE 4

| | Composition (% by weight) | | Film molding | | | | | | | | Laminate |
|---|---|---|---|---|---|---|---|---|---|---|---|
| | | | Cylinder temp. | Screw speed | Die temp. | Die gap | Winding speed | MD Drawing ratio | TD Blow ratio | Film thickness | Peeling strength |
| | (A) | (B) | (°C.) | (rpm) | (°C.) | (mm) | (m/min.) | | | (μm) | (kg/cm) |
| Example 5 | A-1 87 | B-3 13 | 350 | 40 | 350 | 1.5 | 15 | 3.2 | 2.8 | 31 | 2.9 |
| Example 6 | A-1 72 | B-3 28 | 350 | 40 | 350 | 1.5 | 15 | 4.7 | 4.3 | 19 | 7.9 |
| Example 7 | A-2 78 | B-1 22 | 280 | 40 | 280 | 1.5 | 15 | 4.1 | 5.1 | 11 | 2.0 |

What is claimed is:

1. A laminate of a film of a liquid crystal polyester resin composition comprising (A) from 55 through 99% by weight of a liquid crystal polyester and (B) from 45 through 1% by weight of an epoxy group-containing thermoplastic resin laminated on a metallic foil.

2. The laminate according to claim 1, in which said thermoplastic resin (B) is a copolymer containing 0.1 through 30% by weight of an unsaturated glycidyl carboxylate unit and/or an unsaturated glycidyl ether unit.

3. The laminate according to claim 1, in which said thermoplastic resin (B) is an epoxy group-containing ethylene copolymer comprising (a) 50 through 99.9% by weight of an ethylene unit, (b) 0.1 through 30% by weight of an unsaturated glycidyl carboxylate unit and/or an unsaturated glycidyl ether unit and (c) 0 through 49.9% by weight of an ethylenically unsaturated ester compound unit.

4. The laminate according to claim 1, in which said liquid crystal polyester of the component (A) is obtained through a reaction of an aromatic dicarboxylic acid, an aromatic diol, and an aromatic hydroxycarboxylic acid.

5. The laminate according to claim 1, in which said liquid crystal polyester of the component (A) is obtained through a reaction of different kinds of aromatic hydroxycarboxylic acids.

6. The laminate according to claim 1, in which said liquid crystal polyester of the component (A) comprises repeating units given below:

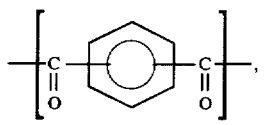

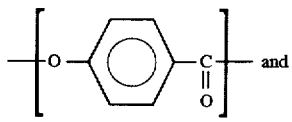

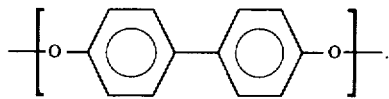

7. The laminate according to claim 1, in which said liquid crystal polyester of the component (A) comprises repeating units given below:

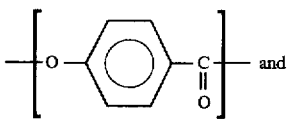

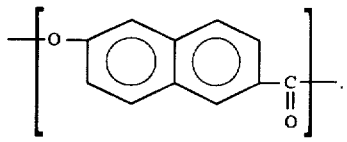

8. The laminate according to claim 1, in which said liquid crystal polyester of the component (A) comprises repeating units given below:

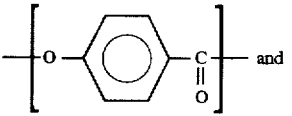

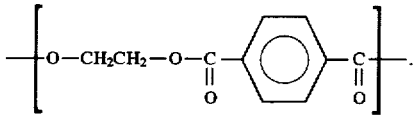

9. The laminate according to claim 1, in which said liquid crystal polyester of the component (A) comprises repeating unit given below:

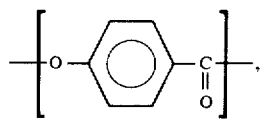

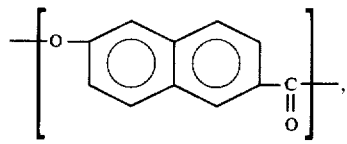

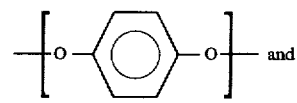

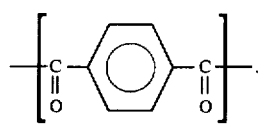

10. The laminate according to claim 1, in which the stiffness modulus of said thermoplastic resin (B) is in the range of 10 through 1500 kg/cm$^2$.

11. The laminate according to claim 1, in which said metallic foil is selected from the group consisting of foils of gold, silver, copper, nickel and aluminum.

12. The laminate according to claim 1, in which said metallic foil is copper foil.

13. A printed-wiring board comprising a laminate according to any one of claims 1 to 12.

14. The laminate according to claim 8, in which component (A) is present in an amount of from 65 through 98% by weight and component (B) is present in an amount of from 35 through 2% by weight.

15. The laminate according to claim 1, in which the stiffness modulus of said thermoplastic resin (B) is in the range of 20 through 1300 kg/cm$^2$.

16. The laminate according to claim 5, wherein repeating units of component (A) originating from the different kinds of aromatic hydroxycarboxylic acids are as follows:

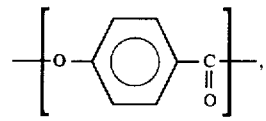

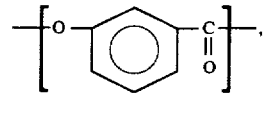

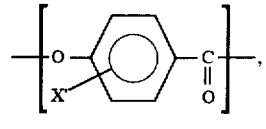

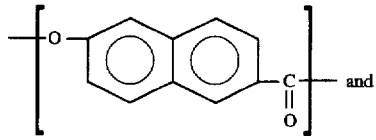

-continued

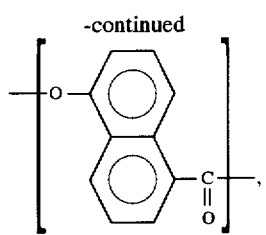

wherein X is halogen or alkyl.

17. A laminate of a film of a liquid crystal polyester resin composition comprising (A) from 55 through 99% by weight of a liquid crystal polyester and (B) from 45 through 1% by weight of an epoxy group-containing thermoplastic resin laminated on a metallic foil, without an adhesive layer.

18. A laminate of a film of a liquid crystal polyester resin composition comprising (A) from 55 through 99% by weight of a liquid crystal polyester and (B) from 45 through 1% by weight of an epoxy group-containing thermoplastic resin laminated on a metallic foil, and an adhesive layer disposed therebetween.

* * * * *